(12) United States Patent
Nogome

(10) Patent No.: US 6,777,301 B2
(45) Date of Patent: Aug. 17, 2004

(54) METHOD OF PRODUCING HETERO-JUNCTION BIPOLAR TRANSISTOR

(75) Inventor: Masanobu Nogome, Bizen (JP)

(73) Assignee: Matsushita Electric Co., Ltd., Osaka (JP)

(*) Notice: Subject to any disclaimer, the term of this patent is extended or adjusted under 35 U.S.C. 154(b) by 126 days.

(21) Appl. No.: 10/259,271

(22) Filed: Sep. 26, 2002

(65) Prior Publication Data

US 2003/0096470 A1 May 22, 2003

(30) Foreign Application Priority Data

Oct. 2, 2001 (JP) .......................................... 2001-306718

(51) Int. Cl.⁷ .............................................. H01L 21/331
(52) U.S. Cl. ....................................... 438/312; 438/315
(58) Field of Search ................................. 438/309–351

(56) References Cited

U.S. PATENT DOCUMENTS 5,411,632 A    5/1995   Delage et al.
5,856,209 A  * 1/1999   Imanishi ...................... 438/47

* cited by examiner

Primary Examiner—H. Jey Tsai
(74) Attorney, Agent, or Firm—Merchant & Gould P.C.

(57) ABSTRACT

A method of producing a hetero-junction bipolar transistor includes: laminating semiconductor layers that are to be a subcollector layer, a collector layer, a base layer, an emitter layer and an emitter cap layer successively on one surface of a semi-insulating substrate; and forming an electrode layer on the emitter cap layer. The method also includes adjusting the shape of the emitter cap layer to be a predetermined shape by wet etching; and removing end portions of the electrode layer so that the edges of the electrode layer are substantially aligned to the edges of the top face of the emitter cap layer. Furthermore, the method includes removing a surface oxidized layer formed on the emitter layer. Thus, defective etching of the emitter layer including an element P of group V is resolved, and a hetero-junction bipolar transistor having predetermined properties can be produced stably.

7 Claims, 3 Drawing Sheets

METHOD OF PRODUCING HETERO-JUNCTION BIPOLAR TRANSISTOR

BACKGROUND OF THE INVENTION

1. Field of the Invention

The present invention relates to a method of producing a hetero-junction bipolar transistor widely used for a transmitting high-output power amplifier.

2. Related Background Art

A Hetero-junction Bipolar Transistor (hereinafter, HBT will be referred to) is a bipolar transistor including an emitter-base junction made of different semiconductor materials, wherein the band-gap of the emitter layer is larger than that of the base layer. As compared with a field-effect transistor (FET), an HBT is more desirable in that it can be operated with a single power source, the number of parts can be reduced, and various properties such as high gain and low distortion, and the like, are achieved. Applications for HBTs are expected to be broadened as a device of a transmitting high-output power amplifier used as a part of a cellular phone.

An HBT is produced by successively laminating semiconductor layers, mainly gallium arsenide (GaAs)-based semiconductor layers, by epitaxial growth on a semi-insulating substrate and by wet etching the laminated semiconductor layers to form an emitter layer, a base layer and a collector, separately. For the emitter layer, an n-type InGaP layer is used in general, which has less current carrying degradation and higher reliability as compared with AlGaAs. In addition, electrodes including TiPtAu, AuGeNi, etc. are connected to the formed emitter, base and collector layers.

FIG. 2 is a cross-sectional view showing a structure of a general HBT in which semiconductor layers are laminated by epitaxial growth. On one surface of a semi-insulating substrate 1 of a group III–V compound semiconductor material, a subcollector layer 2 including n$^+$-type GaAs [impurity concentration: 5×10$^{18}$ cm$^{-3}$, film thickness: approximately 600 nm], a collector layer 3 including n-type GaAs [impurity concentration: 5×10$^{16}$ cm$^{-3}$, film thickness: approximately 600 nm], a base layer 4 including p-type GaAs [impurity concentration: 4×10$^{19}$ cm$^{-3}$, film thickness: approximately 100 nm], an emitter layer 5 including n-type InGaP [impurity concentration: 3×10$^{17}$ cm$^{-3}$, film thickness: approximately 30 nm] and an emitter cap layer 6 including n$^+$-type GaAs [impurity concentration: 5×10$^{18}$ cm$^{-3}$, film thickness: approximately 400 nm] are laminated successively by the metal-organic chemical vapor deposition method (hereinafter, MOCVD method will be referred to), etc.

FIG. 3 is a cross-sectional view showing a device structure of a general HBT. In the semiconductor layers formed as mentioned above, a WSi (tungsten silicide) layer 10 is formed on the emitter cap layer 6 as an electrode layer for improving the reliability. Further on the WSi layer 10, an emitter electrode 8 (made of TiPtAu) connecting to wiring is formed. Furthermore, on the base layer 4, a base electrode 7 (made of TiPtAu) is formed in a region formed by etching the emitter layer 5. Furthermore, on the subcollector layer 2, a collector electrode 9 (made of AuGeNi/Au) is formed in a region formed by etching the subcollector layer 2 and the collector layer 3.

FIGS. 4A to 4F show steps of a conventional method of producing an HBT device. Firstly, as shown in FIG. 4A, on the emitter cap layer 6 of the device structure formed as mentioned above, a WSi layer 10 provided underside the emitter electrode 8 is formed by sputtering. Thereafter, a resist 100 is patterned so as to shape cells 20 as shown in FIG. 4E. Furthermore, by reactive ion-beam etching (hereinafter, RIE will be referred to) using CF$_4$ and SF$_6$ gas, the shape of the WSi layer 10 is adjusted under the conditions of in-chamber pressure of 100 mTorr and RF of 120 W.

Next, as shown in FIG. 4B, the shape of the emitter cap layer 6 is adjusted by wet etching using a phosphoric acid-based etchant containing phosphoric acid, hydrogen peroxide solution, and water in the ratio of 4:1:45. This wet etching is carried out for a rather longer time, that is, when the thickness of the emitter cap layer 6 is, for example, 400 nm, the etching is carried out for the time assuming that the thickness is about 450 nm. At this time, depending upon the above-mentioned phosphoric acid-based etchant, the emitter layer 5 is not removed and only a part of the emitter cap layer 6 is removed, and thus a so-called selective etching is carried out. At this time, the hydrogen peroxide solution contained in the above-mentioned etchant acts as an oxidizer, and as a result, a thin surface oxidized layer 50 is formed on the surface of the emitter layer 5. Furthermore, at this time, the WSi layer 10 partially protrudes from the ends of the top portion of the emitter cap layer 6 by so-called side etching so as to form eave portions 10a.

Next, as shown in FIG. 4C, the eave portions 10a are removed by RIE using only SF$_6$ gas under the conditions of in-chamber pressure of 300 mTorr and RF of 100 W.

Next, as shown FIG. 4D, the resist 100 is removed, and then as shown in FIG. 4E, the shape of the emitter layer 5 is adjusted by wet etching using a hydrochloric acid-based etchant containing hydrochloric acid, phosphoric acid and water in the ratio of 3:2:2 so as to form the cells 20.

At this time, the cells 20 are formed on a chip at intervals of about 10 μm with significantly high densities. Therefore, in the region around the cells 20, the etchant cannot circulate sufficiently. Furthermore, since the emitter layer 5 containing an element P of group V is covered with the surface oxidized layer 50 that was formed when the wet etching was carried out using the phosphoric acid-based etchant, a part of the emitter layer 5 is not removed by the above-mentioned hydrochloric acid-based etchant and remains in the form of a ring.

As shown in FIG. 4F, since a region in which the collector electrode 9 is to be disposed is formed in this state, when the wet etching is carried out on the base layer 4 and the middle portion of the collector layer 3 by using a phosphoric acid-based etchant, the areas of the emitter layer 5, the base layer 4, and the collector layer 3 are formed larger than the designed values, which may cause the property abnormality in that, for example, the amplification factor "hfe" of grounded emitter current of the HBT does not become a designed value.

SUMMARY OF THE INVENTION

It is an object of the present invention to produce an HBT having predetermined properties by resolving the problem that the amplification factor "hfe" of grounded emitter current of an HBT does not become a designed value because of etching defectiveness of the emitter layer including an element P in group V.

According to the present invention, when a hetero-bipolar transistor is produced, a surface oxidized layer formed on the emitter layer including an element P of group V is removed efficiently and semiconductor layers are formed as designed by resolving etching defectiveness, and thus HBTs having predetermined properties can be produced stably.

DETAILED DESCRIPTION OF THE INVENTION

Hereinafter, the embodiment of the present invention will be explained with reference to drawings.

Figure 4A:
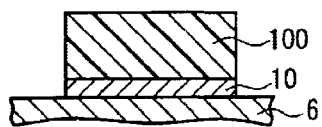
FIGS. 4A to 4F are cross-sectional views showing steps in a conventional method of producing a hetero-junction bipolar transistor.
Figure 4B:
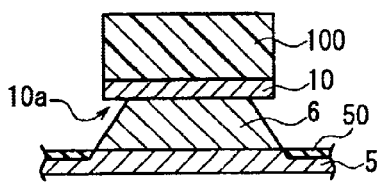
Figure 4C:
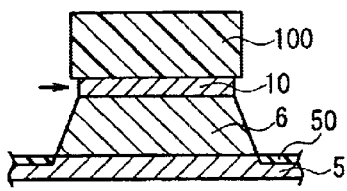
Figure 4D:
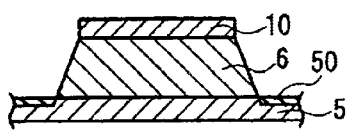
Figure 4E:
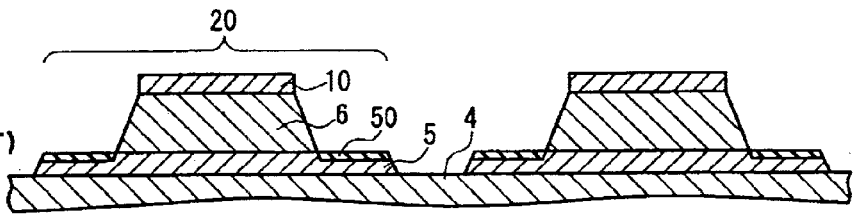
Figure 4F:
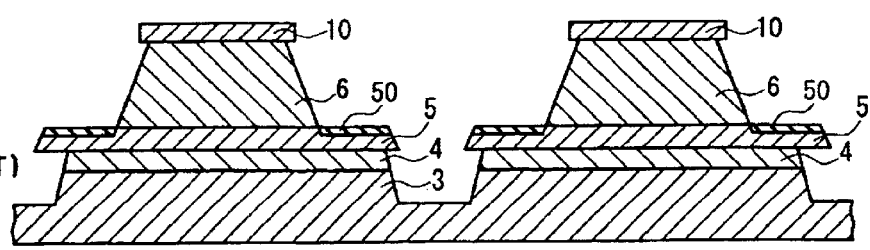

FIG. 1 is a cross-sectional view showing steps in a method of producing an HBT device according to this embodiment. FIGS. 1A to 1C are similar to FIGS. 4A to 4C according to the prior art mentioned above. Therefore, parts that are different from those of the prior art will be explained hereinafter.

Figure 1A:
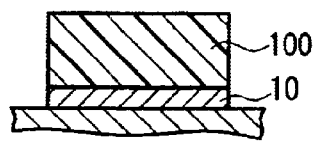
FIGS. 1A to 1F are cross-sectional views showing steps in a method of producing a hetero-junction bipolar transistor according to the present invention.
Figure 1B:
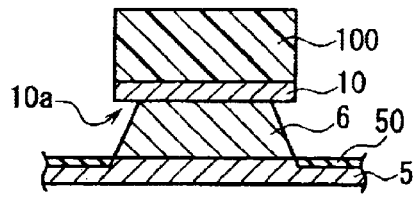
Figure 1C:
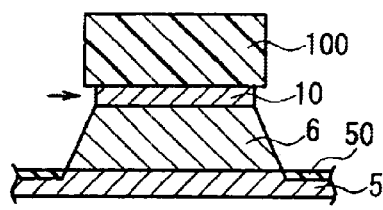
Figure 1D:
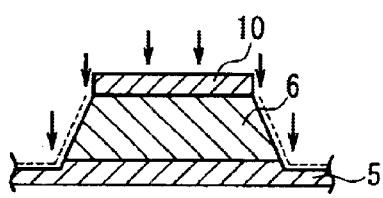

As shown in FIG. 1D, a resist 100 is removed and further a surface oxidized layer 50 is removed from the emitter layer 5 by etching the semiconductor layers including the layer 50 and a part of the emitter layer 6 to a depth of about 10 nm by, for example, inactive ion beam etching (hereinafter, "ion milling" will be referred to) using the sputter effect by the inactive ion kinetic energy. At this time, the ion milling is carried out under the conditions where, for example, beam voltage is 600 V, beam current is 300 mA, a tilt angle of a wafer is 30 degrees and an etching time is 0.1 minutes. Herein, the resist 100 has already been removed and the surface oxidized layer 50 is not covered with the resist 100, and thus the surface oxidized layer 50 can be removed by ion milling efficiently.

Figure 1E:
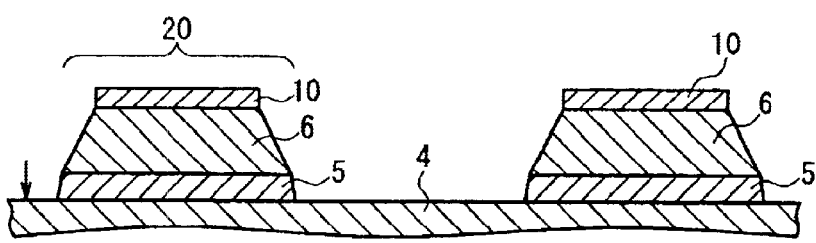

Next, as shown in FIG. 1E, the shape of the emitter layer 5 is adjusted by wet etching using a hydrochloric acid-based etchant containing hydrochloric acid, phosphoric acid, and water in the range of 3:2:2. Note here that the composition ratio of the hydrochloric acid-based etchant may be in the range of hydrochloric acid:phosphoric acid:water= 2.5–3.5:1.5–2.5:1.5–2.5.

At this time, in the region around the cells 20, the circulation of the etchant is bad because the cells 20 are formed on the chip with high density as in the prior art. However, since the surface oxidized layer 50 has already been removed from the emitter layer 5, the shape of the emitter layer 5 can be adjusted smoothly.

Figure 1F:
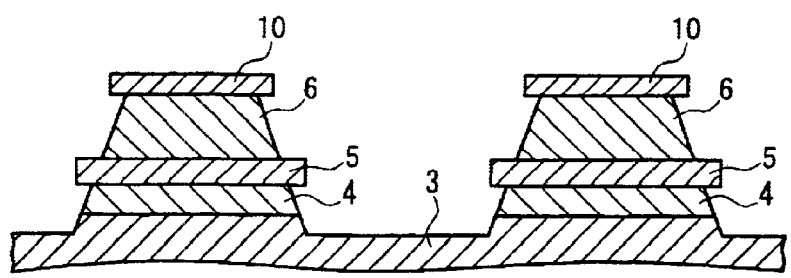
Figure 2:
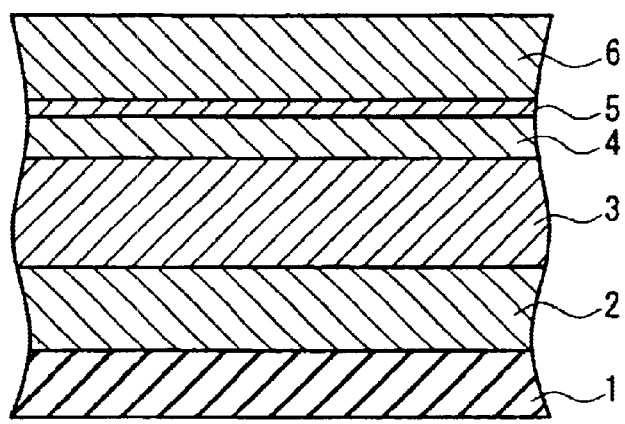
FIG. 2 is a cross-sectional view showing an epi-structure of a hetero-junction bipolar transistor.
Figure 3:
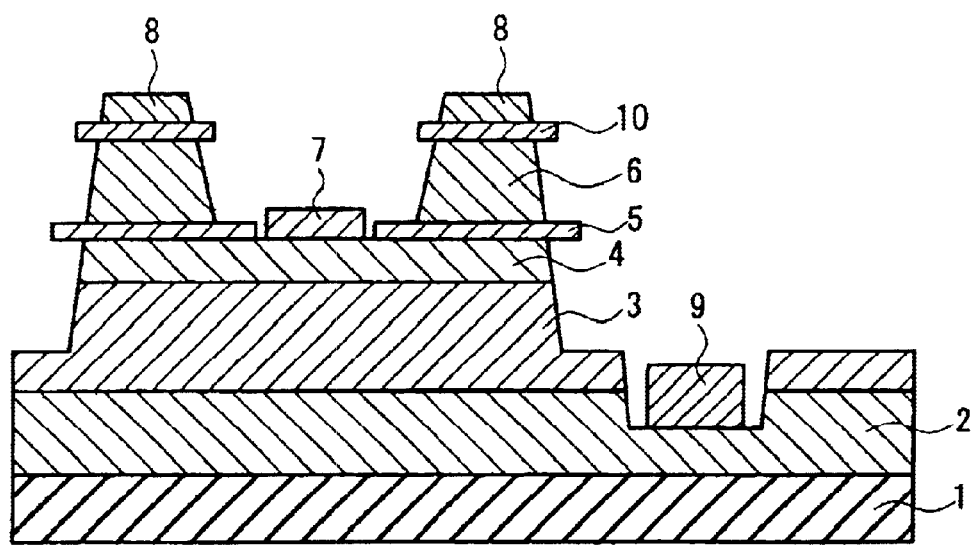
FIG. 3 is a cross-sectional view showing a device structure of a hetero-junction bipolar transistor.

Next, as shown in FIG. 1F, in order to form a region in which the collector electrode is disposed, the etching is carried out on the base layer 4 and the middle portion of the collector layer 3 by using a phosphoric acid-based etchant containing phosphoric acid, hydrogen peroxide solution, and water in the ratio of 4:1:45. Note here that the composition ratio of the phosphoric acid-based etchant may be in the range of phosphoric acid: hydrogen peroxide solution:water=3–5:0.5–1.5:40–50. According to this configuration as mentioned above, no emitter layer 5 remains in the form of a ring without being etched in the region around the cells 20, and thus the emitter layer 5, the base layer 4 and the collector layer 3 are formed as designed.

Note here that by further etching the cell 20, a region to be provided with the base electrode 7 is formed. The process thereof is the same as that in the prior art, and so the explanation therefor will be omitted herein.

According to this embodiment, at the time of producing HBTs, a surface oxidized layer formed on the emitter layer including n-type InGaP, etc. is removed efficiently by, for example, inactive ion beam etching using the sputter effect. Thus, the problem of defective etching is resolved and the semiconductor layers under the emitter layer can be formed as designed. Consequently, HBTs having desired properties can be produced stably.

Note here that the present invention is not to be limited to the illustrated embodiments provided above without considering the spirit and scope of the invention.

What is claimed is:

1. A method of producing a hetero-junction bipolar transistor, the method comprising laminating semiconductor layers that are to be a collector layer, a base layer, an emitter layer and an emitter cap layer successively on one surface of a semi-insulating substrate, forming an electrode layer on the emitter cap layer, adjusting the shape of the emitter cap layer to be a predetermined shape by wet etching, removing the end portions of the electrode layer so that the edges of the electrode layer are substantially aligned to the edges of the top face of the emitter cap layer, removing a surface oxidized layer formed on the emitter layer, and forming a region in which a collector electrode is disposed by wet etching the emitter layer, the base layer, and the collector layer.

2. The method of producing a hetero-junction bipolar transistor according to claim 1, comprising laminating a subcollector layer including $n^+$-type GaAs, a collector layer including n-type GaAs, a base layer including p-type GaAs, an emitter layer including n-type InGaP, and an emitter cap layer including $n^+$-type GaAs successively on one surface of a semi-insulating substrate made of a group III–V compound semiconductor material, and forming an electrode layer comprising WSi as a main component on the emitter cap layer.

3. The method of producing a hetero-junction bipolar transistor according to claim 1, wherein the emitter cap layer is wet etched using a solution comprising phosphoric acid, and the emitter layer is wet etched using a solution comprising hydrochloric acid.

4. The method of producing a hetero-junction bipolar transistor according to claim 3, wherein the solution comprising hydrochloric acid is an aqueous solution containing hydrochloric acid, phosphoric acid, and water in the ratio of 2.5–3.5:1.5–2.5:1.5–2.5.

5. The method of producing a hetero-junction bipolar transistor according to claim 3, wherein the solution comprising phosphoric acid is an aqueous solution containing phosphoric acid, hydrogen peroxide solution, and water in the ratio of 3–5:0.5–1.5:40–50.

6. The method of producing a hetero-junction bipolar transistor according to claim 1, wherein in removing end portions of the electrode layer so that the edges of the electrode layer are substantially aligned to the edges of the top face of the emitter cap layer, reactive ion beam etching is used under the operating conditions where only $SF_6$ gas is used and the pressure is 300 mTorr or more.

7. The method of producing a hetero-junction bipolar transistor according to claim 1, wherein inactive ion beam etching using a sputter effect by inactive ion kinetic energy is used for removing a surface oxidized layer formed on the emitter layer.

* * * * *

UNITED STATES PATENT AND TRADEMARK OFFICE
CERTIFICATE OF CORRECTION

PATENT NO. : 6,777,301 B2
DATED : August 17, 2004
INVENTOR(S) : Nogome

It is certified that error appears in the above-identified patent and that said Letters Patent is hereby corrected as shown below:

<u>Title page,</u>
Item [73], Assignee, "Matsushita Electric Co., Ltd." should read -- Matsushita Electric Industrial Co., Ltd. --.

Signed and Sealed this

Fourth Day of October , 2005

JON W. DUDAS
*Director of the United States Patent and Trademark Office*